United States Patent
Koizumi et al.

(10) Patent No.: US 8,501,080 B2
(45) Date of Patent: Aug. 6, 2013

(54) METHOD FOR PRODUCING CRYSTALLOGRAPHICALLY ORIENTED CERAMIC

(75) Inventors: Takaaki Koizumi, Tajimi (JP); Takuya Katsuno, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 406 days.

(21) Appl. No.: 12/825,621

(22) Filed: Jun. 29, 2010

(65) Prior Publication Data

US 2011/0012049 A1    Jan. 20, 2011

(30) Foreign Application Priority Data

Jul. 16, 2009 (JP) ................. 2009-167722
May 17, 2010 (JP) ................. 2010-113575

(51) Int. Cl.
*B28B 1/14* (2006.01)

(52) U.S. Cl.
USPC ............................ 264/614; 264/603; 264/650

(58) Field of Classification Search
USPC ......................... 264/603, 614, 650
See application file for complete search history.

(56) References Cited

U.S. PATENT DOCUMENTS

| | | | |
|---|---|---|---|
| 4,626,369 A * | 12/1986 | Walker, Jr. ............. | 252/62.9 PZ |
| 6,013,970 A | 1/2000 | Nishiwaki et al. | |
| 6,103,072 A | 8/2000 | Nishiwaki et al. | |
| 7,678,290 B2 * | 3/2010 | Hammer-Altmann et al. ................. | 252/62.9 PZ |
| 8,237,338 B2 * | 8/2012 | Koizumi et al. ............. | 310/358 |
| 2003/0067509 A1 * | 4/2003 | Sakamaki et al. ............. | 347/68 |
| 2004/0071883 A1 * | 4/2004 | Ogawa et al. ................ | 427/378 |
| 2004/0253746 A1 * | 12/2004 | Nakagawa et al. ............ | 438/3 |
| 2006/0027847 A1 * | 2/2006 | Koo et al. ..................... | 257/295 |
| 2008/0237531 A1 * | 10/2008 | Tsukada et al. ......... | 252/62.9 PZ |
| 2010/0071179 A1 * | 3/2010 | Koizumi et al. ............. | 29/25.35 |
| 2010/0301703 A1 * | 12/2010 | Chen et al. ................... | 310/318 |
| 2011/0014362 A1 * | 1/2011 | Koizumi et al. ............. | 427/100 |
| 2011/0241479 A1 * | 10/2011 | Koizumi et al. ............. | 310/311 |
| 2011/0241493 A1 * | 10/2011 | Koizumi et al. ............. | 310/363 |
| 2011/0284387 A1 * | 11/2011 | Koizumi ..................... | 205/109 |

FOREIGN PATENT DOCUMENTS

| | | |
|---|---|---|
| JP | 09-298324 A1 | 11/1997 |
| JP | 11-191646 A1 | 7/1999 |
| JP | 2008-184629 A1 | 8/2008 |

* cited by examiner

*Primary Examiner* — Joseph S Del Sole
*Assistant Examiner* — Russell Kemmerle, III
(74) *Attorney, Agent, or Firm* — Burr & Brown (57) ABSTRACT

A method for producing a crystallographically oriented ceramic including a preparation step of preparing a template layer having uniform crystal orientation in a predetermined direction, a formation step of forming a shaped body including a matrix layer arranged on the template layer, the matrix layer being composed of a mixed material that contains a lead-containing material and an additional material containing lithium and boron, and a firing step of firing the shaped body formed in the formation step at a predetermined firing temperature. Furthermore, after the firing step, a post-annealing step of heating the shaped body to remove lithium and boron may be included.

11 Claims, 6 Drawing Sheets

Example 1  Comparative example 2

METHOD FOR PRODUCING CRYSTALLOGRAPHICALLY ORIENTED CERAMIC

BACKGROUND OF THE INVENTION

1. Field of the Invention

The present invention relates to a method for producing a crystallographically oriented ceramic, and more specifically, it relates to a method for producing a crystallographically oriented ceramic used for a piezoelectric/electrostrictive component.

2. Description of the Related Art

Hitherto, regarding a method for producing a crystallographically oriented ceramic, piezoelectric thin films as typified by thin films composed of lead zirconate titanate (hereinafter, referred to as "PZT") have been formed by depositing films using, for example, physical vapor deposition (PVD) such as sputtering, chemical vapor deposition (CVD), and a sol-gel method and firing the films. In the vapor phase deposition, however, it is difficult to increase the film thickness to, for example, 1 µm or more. The use of the sol-gel method sometimes causes a reduction in density, thus failing to provide satisfactory piezoelectric properties. For example, Patent Document 1 discloses that a method includes forming seed crystals of a piezoelectric PZT thin film so as to have a grain size of 0.05 µm to 1 µm, the seed crystals being oriented either in the (100) plane when formed by a sol-gel method or in the (111) plane when formed by sputtering, and performing hydrothermal synthesis to form a thick film. For this piezoelectric film, it is possible to increase the thickness relatively easily and perform fine patterning. Patent Document 2 discloses that a method for producing a highly oriented PZT thin film includes growing a PZT thin film by sputtering while irradiating the growth surface of a crystal growth substrate with an electron beam. Patent Document 3 discloses that a method for producing a piezoelectric element having a piezoelectric thin film interposed between a top electrode and a bottom electrode includes forming titanium islands, serving as nuclei of a piezoelectric substance, on grain boundaries of the bottom electrode, whereby satisfactory piezoelectric properties are provided.

PRIOR ART DOCUMENTS

Patent Documents

[Patent Document 1] Japanese Unexamined Patent Application Publication No. 9-298324
[Patent Document 2] Japanese Unexamined Patent Application Publication No. 2008-184629
[Patent Document 3] Japanese Unexamined Patent Application Publication No. 11-191646

SUMMARY OF THE INVENTION

However, the production method described in Patent Document 1 disadvantageously has difficulty in the production because it is necessary to produce the seed crystals of the piezoelectric thin film by sputtering, which has a relatively low productivity, and to perform hydrothermal synthesis to form a thick film. Furthermore, the method has a problem in which the seed crystals of the piezoelectric thin film are not easily oriented in the (100) or (111) plane. In the production method described in Patent Document 2, it is difficult to produce a thick film because of the crystal growth by sputtering or chemical vapor deposition (CVD). In the production method described in Patent Document 3, it is necessary to form the titanium islands. Furthermore, it is difficult to form a thick film. In addition, it is desirable to develop a new technique for easily produce a crystallographically oriented ceramic with a high relative density and a higher degree of orientation regardless of whether a thick crystallographically oriented ceramic film is formed or not.

The present invention has been made in light of the circumstances described above. It is a main object of the present invention to provide an easier method for producing a crystallographically oriented ceramic that contains lead and that has a higher degree of orientation.

The inventors have conducted intensive studies in order to achieve the main object and have found that it is possible to more easily produce a crystallographically oriented ceramic with a higher degree of orientation by preparing a template layer having uniform crystal orientation in a predetermined direction, forming a matrix layer on the template layer, the matrix layer being composed of an additional material containing lithium and boron, and performing firing. The findings have led to the completion of the present invention.

That is, a method for producing a crystallographically oriented ceramic according to the present invention includes a preparation step of preparing a template layer having uniform crystal orientation in a predetermined direction, a formation step of forming a shaped body including a matrix layer arranged on the template layer, the matrix layer being composed of a mixed material that contains a lead-containing material and an additional material containing lithium and boron, and a firing step of firing the shaped body formed in the formation step at a predetermined firing temperature.

The method for producing a crystallographically oriented ceramic of the present invention enables us to more easily produce a crystallographically oriented ceramic with a higher degree of orientation. The exact reason for this is unclear. The reason may be as follows: It is speculated that, for example, although a lead-containing material is not easily formed into a polyhedral shape, the additional material containing lithium and boron probably functions to grow crystals of the lead-containing material for the matrix layer in a polyhedral shape (e.g., a cube). Furthermore, it is speculated that the crystals of the material for the matrix layer are grown on the basis of the crystal orientation of the template layer, so that the ceramic is more easily oriented. Moreover, it is possible to increase the degree of orientation of the lead-containing material by a simple method in which the matrix layer is formed on the template layer having uniform crystal orientation and fired.

DETAILED DESCRIPTION OF THE INVENTION

Figure 1:
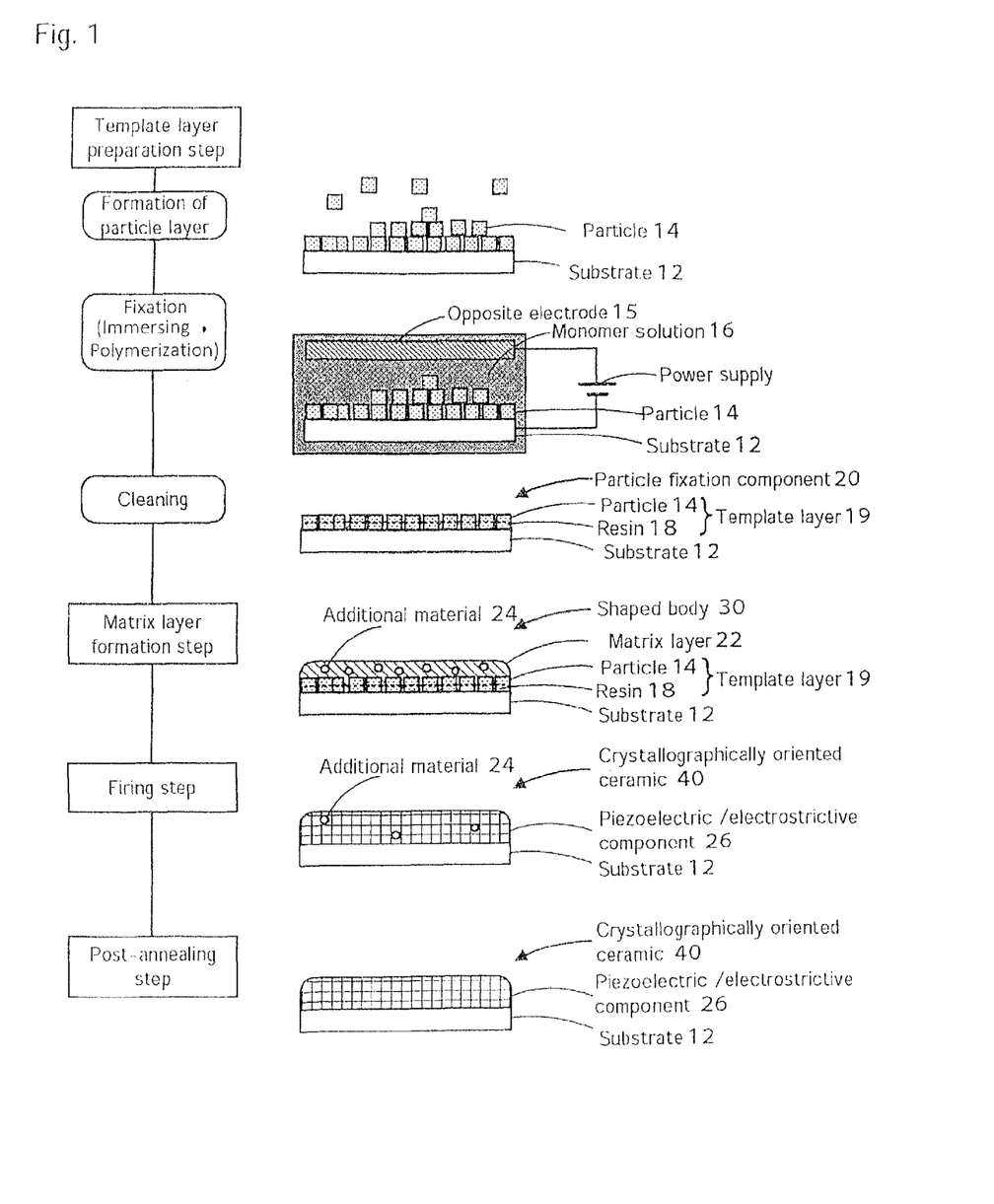
FIG. 1 is an explanatory view illustrating an exemplary method for producing a crystallographically oriented ceramic 40.
Figure 2:
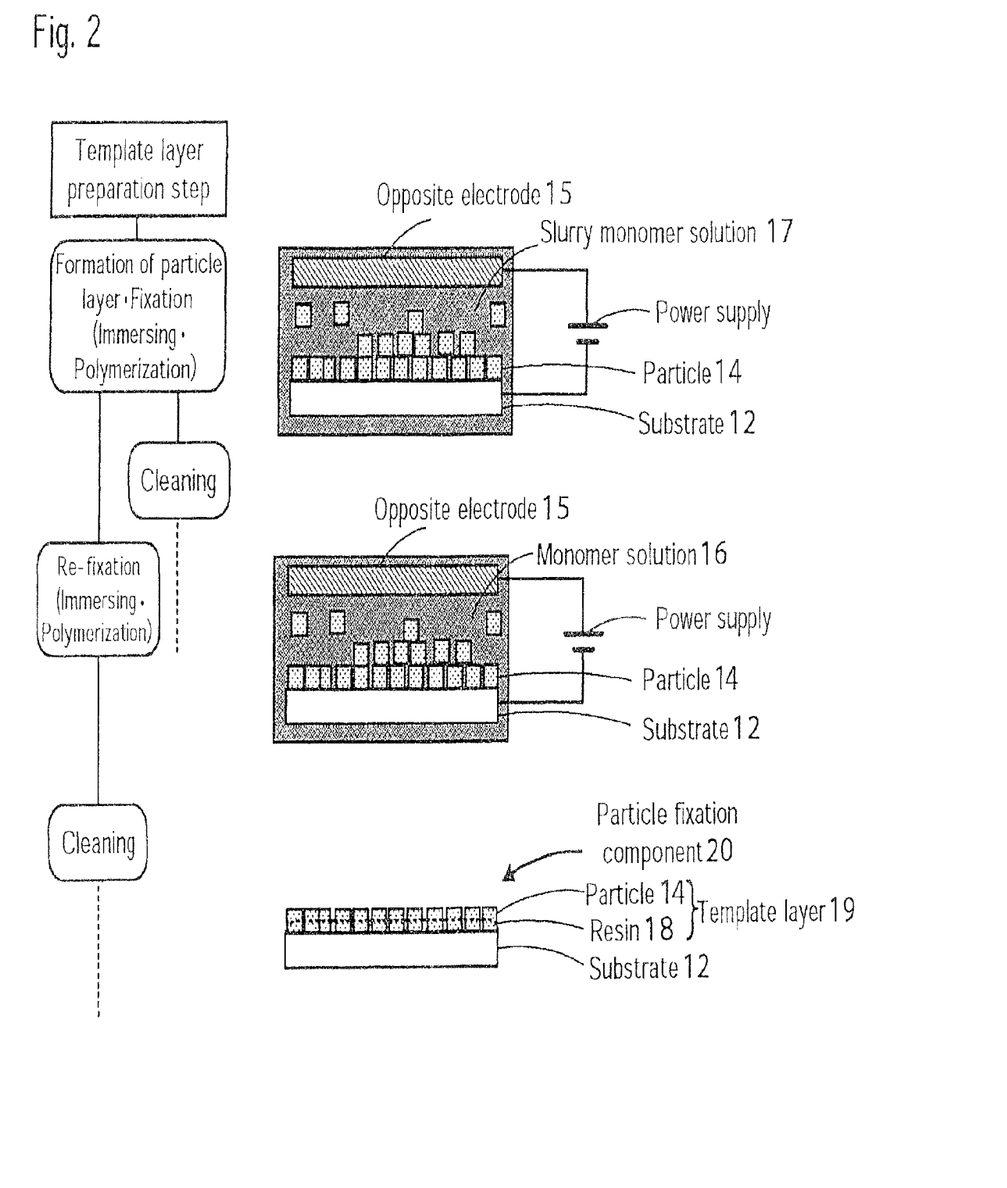
FIG. 2 is an explanatory view illustrating another example of a template layer preparation step.
Figure 3:
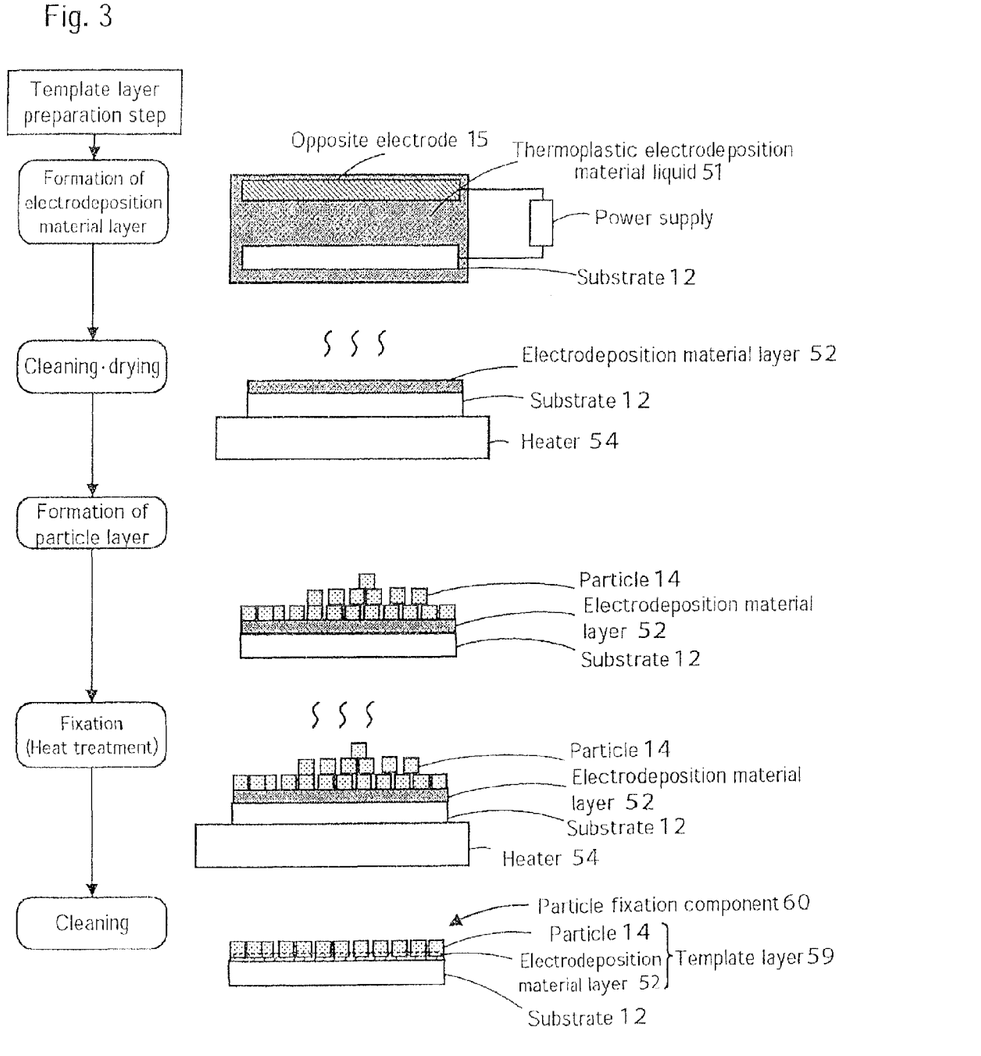
FIG. 3 is an explanatory view illustrating another example of the template layer preparation step.

Embodiments for carrying out the present invention will be described below with reference to the drawings. FIG. 1 is an explanatory view illustrating an exemplary method for producing a ceramic 40. FIGS. 2 and 3 are explanatory views illustrating other examples of a template layer preparation step. A method for producing a crystallographically oriented ceramic according to the present invention may include (1) a template layer preparation step of preparing a template layer having uniform crystal orientation in a predetermined direction, (2) a matrix layer formation step of forming a matrix layer on the template layer, the matrix layer being composed of a mixed material that is prepared by mixing a lead-containing material and an additional material containing lithium and boron, (3) a firing step of firing the resulting shaped body at a predetermined firing temperature, and (4) a post-annealing step of removing the additional material by heating the additional material after the firing.

(1) Template Layer Preparation Step

In this step, the template layer having uniform crystal orientation in a predetermined direction is prepared. Note that the expression "the template layer having uniform crystal orientation in a predetermined direction" includes a template layer in which the crystal orientation of a certain plane (e.g., the (100) plane) in all crystals is completely uniform in a predetermined direction and a template layer in which the crystal orientation of a certain proportion, for example, 60% or more or 80% or more, of all crystals is uniform in a predetermined direction. With respect to the template layer, as illustrated in FIGS. 1 to 3, a template layer 19 may be prepared by fixing crystalline particles (hereinafter, simply referred to as "particles 14") composed of a lead-containing material on a substrate 12 with a fixing compound by heat or a potential difference. For example, as illustrated in FIG. 1, the template layer preparation step may include a particle layer formation treatment to arrange the particles 14 on the substrate 12, a fixation treatment that fixes the particles 14 on the substrate 12, and a cleaning treatment to remove an excess amount of the particles 14. Alternatively, as illustrated in FIG. 2, the template layer preparation step may include a particle layer formation and fixation treatment in which the substrate 12 is immersed in a slurry monomer solution 17 that contains the particles 14 and a monomer for a resin 18 in order to arrange the particles 14 on the substrate 12 and the monomer for the resin 18 is subjected to electrolytic polymerization, a cleaning treatment, and a repolymerization treatment in which the substrate 12 is immersed in a monomer solution 16 and the monomer for the resin 18 is subjected to electrolytic polymerization after the particle layer formation and fixation treatment and before the cleaning treatment.

In the particle layer formation treatment, a particle layer, which is a layer of the particles 14, is formed on the substrate 12. The substrate 12 is not particularly limited so long as the particles 14 can be arranged on a surface of the substrate 12. Examples of a material for the substrate include glass, single crystals, ceramic materials, resins, and metals. Examples of a material for a glass substrate include quartz and non-alkali glass. Examples of a material for a single-crystal substrate include silicon, gallium arsenide, silicon carbide, alumina, and strontium titanate. Examples of a material for a ceramic substrate include stabilized zirconium oxide, aluminum oxide, magnesium oxide, mullite, aluminum nitride, and silicon nitride. Examples of a material for a resin substrate include epoxy-based resins and polyester-based resins. Examples of a material for a metal substrate include stainless steel, aluminum, and platinum. In addition, the metal may be coated with an insulating resin. Here, the substrate 12 is described as being composed of conductive platinum. The particles 14 may be composed of a lead-containing material. For example, the particles 14 may be produced in advance so as to have a polyhedral shape. For example, the polyhedral shape is preferably a cubic shape. Cubic crystals of the lead-containing material may be produced by, for example, hydrothermal synthesis. Examples of the lead-containing material include $Pb(Zr,Ti)O_3$, $Pb(Mg,Nb)(Zr,Ti)O_3$, $Pb(Ni,Nb)(Zr,Ti)O_3$, $Pb(Zn,Nb)(Zr,Ti)O_3$, $Pb(Yb,Nb)(Zr,Ti)O_3$, $(Pb,Sr)(Zr,Ti)O_3$, $(Pb,Ba)(Zr,Ti)O_3$, $(Pb,La)(Zr,Ti)O_3$, $(Bi,Pb)(Ni,Nb)(Zr,Ti)O_3$, $(Bi,Pb)(Mg,Nb)(Zr,Ti)O_3$, $(Bi,Pb)(Zn,Nb)(Zr,Ti)O_3$, and $(Pb,Sr,La)(Mg,Ni,Nb)(Zr,Ti)O_3$. One or more of these materials may be used. In addition, raw materials (for example, hydroxides and oxides) that will have these compositions after firing may be used. A method for forming the particle layer is not particularly limited so long as the fixation treatment after the formation can be performed. The particle layer may be directly formed without immersing the substrate 12 in a solution. Alternatively, the particle layer may be formed by immersing the substrate 12 in a solution (slurry) containing the particles 14. Examples of the former method include a spray application method, a spin coating method, and a doctor blade method. One or more of these methods may be employed. Examples of the latter method include a method including immersing the substrate 12 in a slurry in which the particles 14 are dispersed and allowing the substrate 12 to stand to sediment the particles 14, an LB method in which the particles 14 are aligned at a liquid-phase interface and then the immersed substrate 12 is pulled out, electrophoresis, and dipping. One or more of these methods may be employed. Among these methods, the method including immersing the substrate 12 in the slurry to sediment the particles 14 is preferably employed because of a smooth transition from the method to the subsequent fixation treatment (electrolytic polymerization of a polymer). The application of, for example, mechanical vibration, a sound wave, heat, light, or a magnetic field during the formation of the particle layer may result in closer packing. Furthermore, the particle layer is immersed in the solution in the fixation treatment. Thus, after the formation of the particle layer, the particle layer may be dried or heated to increase the strength of the particle layer.

In the fixation treatment, for example, the template layer 19 including the fixed particles 14 may be formed by immersing the substrate 12 in the monomer solution 16 containing a chemical substance (monomer) that can be polymerized by electrolytic polymerization and subjecting the monomer to electrolytic polymerization on the substrate 12 by applying a potential difference between the substrate 12 and the opposite electrode 15 with a opposite electrode 15 facing the substrate 12. Alternatively, for example, as illustrated in FIG. 2, the substrate 12 may be immersed in the slurry monomer solution 17 containing the particles 14 and a monomer to be subjected to electrolytic polymerization to form a particle layer, and then the monomer may be subjected to electrolytic polymerization in the slurry monomer solution 17, thereby ensuring the fixation of the particle layer with the resin 18 prepared by the polymerization. In this case, after the formation of the particle layer, the fixation treatment can be performed as it is. That is, the fixation treatment is more easily performed, which is preferred. Furthermore, for example, in the particle layer formation treatment, the substrate 12 may be immersed in and pulled out from the slurry monomer solution 17 in which the layer of the particles 14 floats on the surface of the solution with the opposite electrode 15 facing the substrate 12, thereby forming a particle layer on the substrate 12. In the fixation treatment, the monomer may be subjected to electrolytic polymerization by applying a potential difference between the substrate 12 and the opposite electrode 15 during the pulling out of the substrate 12, thereby ensuring the fixation of the particle layer with the resin 18 prepared by the polymerization. In this case, the formation of the particle layer and the fixation of the particles 14 can be performed at almost the same time, and a relatively thin particle layer can be produced. Here, the monomer solution 16 may be a solution and/or dispersion containing a monomer that can be polymerized by electrolytic polymerization. Examples of the monomer include vinyl monomers, such as styrene and N-vinylcarbazole, aromatic ring compounds, such as aniline and phenol, and heterocyclic compounds, such as pyrrole, thiophene, and furan. Examples of the electrolytic polymerization include the case where a polymerization reaction occurs with radical cations or radical anions, the case where a coexisting supporting electrolyte or additive is oxidized or reduced to form reactive species, e.g., cations, anions, or free radicals, causing a polymerization reaction, and cases where chain polymerization and successive polymerization occur in response to the type of monomer. As the resin 18, a polymer of, for example, pyrrole, alkylpyrrole, aminopyrrole, aniline, thiophene, alkylthiophene, or a thiophene derivative is preferred. An aqueous solution of pyrrole is preferably used because it can be handled as a solvent. To induce electrolytic polymerization, an alkylbenzene sulfonate, e.g., sodium p-toluenesulfonate, sodium ethylbenzenesulfonate, or sodium dodecylbenzenesulfonate, may be added as an oxidant to the solution. The electrolytic polymerization may be performed by arranging the opposite electrode 15 in the monomer solution 16 and controlling, for example, electrical conditions (voltage and current) and the treatment time in response to the diameter of each of the particles to be fixed, the size and thickness of the particle layer. Thereby, the template layer 19 including the particles 14 fixed with the resin 18 formed by electrolytic polymerization is formed on the substrate 12. The particles 14 are mechanically fixed in a state where voids among the particles 14 are filled with the resin 18. Thus, the template layer 19 is firmly formed on the substrate 12.

In the cleaning treatment, an excess amount of the particles 14 on the substrate 12 is removed. Particles that are not fixed with the resin 18 formed by electrolytic polymerization can be removed by cleaning with running water or ultrasonic cleaning. Thereby, a particle fixation component 20 in which the particles 14 are fixed on the substrate 12 with the resin 18 can be produced by the easy treatment.

In the repolymerization treatment, as illustrated in the second diagram of FIG. 2, after the particle layer formation and fixation treatment and before the cleaning treatment, the substrate 12 including the particle layer may be immersed in the solution that does not contain the particles 14 but contains the monomer, and then the monomer may be subjected to electrolytic polymerization again by applying a potential difference between the substrate 12 and the opposite electrode 15. Thereby, the polymer is further formed on the template layer 19, so that the upper layer of the particles 14 can be readily removed. It is thus possible to obtain the particle fixation component 20 provided with the template layer 19 including a single layer of the particles 14 formed on the substrate 12. For example, in the case where the particles 14 each having submicrometers to several micrometers in size are fixed with a conductive polymer, electrolytic polymerization is performed again in a conductive monomer solution, thereby forming a fixed layer, which is a single layer of the particle layer. After this repolymerization treatment, the foregoing cleaning treatment may be performed. Furthermore, the foregoing cleaning treatment may be performed before and after the repolymerization treatment.

Alternatively, in the fixation treatment, as illustrated in FIG. 3, a particle fixation component 60 including the particles 14 fixed on the substrate 12 may be formed using a thermoplastic electrodeposition material, serving as a fixing compound, in place of the chemical substance that can be polymerized by electrolytic polymerization. Specifically, an electrodeposition material layer 52, which is a layer composed of the thermoplastic electrodeposition material, is formed on the substrate 12 (electrodeposition material layer formation treatment). The particles 14 are arranged on the electrodeposition material layer 52 (particle layer formation treatment). Then a treatment (fixation treatment) to form a template layer 59 including the particles 14 fixed with the electrodeposition material layer 52 by heating is performed. In the electrodeposition material layer formation treatment, the substrate 12 is immersed in a thermoplastic electrodeposition material liquid 51 containing the thermoplastic electrodeposition material. The electrodeposition material layer 52, which is a layer composed of the thermoplastic electrodeposition material, is formed by applying a potential difference between the substrate 12 and the opposite electrode 15. Examples of the thermoplastic electrodeposition material that can be used include carbon-based polymers, such as epoxy resins, polyimide resins, polyamide-imide resins, and acrylic resins, silicon-based polymers such as silicone resins, and nanoparticles having charged surfaces on which a dispersant is adsorbed, the nanoparticles being composed of oxides such as alumina. Furthermore, the thermoplastic electrodeposition material may be of a cation type in which a coating component is positively charged or an anion type in which a coating component is negatively charged. The potential of the substrate 12 is determined on the basis of whether the thermoplastic electrodeposition material is of the cation type or the anion type. Examples of a solvent or a dispersion medium include inorganic solvents such as water and organic solvents such as alcohols. Among these, a water-based electrodeposition paint is preferably used because of its easy handling. The thermoplastic electrodeposition material liquid 51 may contain a curing agent such as a blocked isocyanate or a catalyst such as a tin compound. A current is allowed to flow to the substrate 12 with the substrate 12 immersed in the thermoplastic electrodeposition material liquid 51, forming the electrodeposition material layer 52 on a surface of the substrate 12 (see the second diagram of FIG. 3). After the formation of the electrodeposition material layer 52, the electrodeposition material layer 52 may be dried with, for example, a heater 54. Next, the particle layer formation treatment to arrange the particles 14 on the electrodeposition material layer 52 is performed (see the third diagram of FIG. 3). As a method for forming the particle layer, the foregoing method may be employed. Subsequently, the electrodeposition material layer 52 provided with the particle layer is heated. The fixation treatment to form the template layer 59 including the particle layer fixed with the heated electrodeposition material layer 52 is performed (see the fourth diagram of FIG. 3). The fixation treatment may be performed at a temperature at which the electrodeposition material layer 52 is melted or is not melted. A heating method is as follows: Heating may be performed from the substrate 12 side with the heater 54. Alternatively, the substrate 12 may be heated in an oven or the like. Furthermore, the electrodeposition material layer 52 may be irradiated with electromagnetic waves. Heating the thermoplastic electrodeposition material allows the voids among the particles 14 to be filled with the thermoplastic electrodeposition material. Thereby, the particles 14 are mechanically fixed in the state where voids among the particles 14 are filled with the thermoplastic electrodeposition material. Thus, the template layer 59 is firmly formed on the substrate 12.

(2) Matrix Layer Formation Step

In this step, a shaped body including a matrix layer arranged on the template layer is formed, the matrix layer being composed of a mixed material that contains a lead-containing material and an additional material 24 containing lithium and boron. Examples of the additional material 24 containing lithium and boron include $LiBO_2$, $Li_2B_4O_7$, $LiB(OH)_4$, $Li_3BO_3$, $Li_6B_4O_9$, $LiB_3O_5$, and $Li_2B_8O_{13}$. One or more of these materials may be used. The amount of the additional material 24 added is preferably in the range of 0.05% by weight to 10% by weight with respect to the matrix layer. An amount added of 0.05% by weight or more preferably results in a stronger orientation effect. At an amount added of 10% by weight or less, the additional material is less likely to remain after firing, which is preferred. As the lead-containing material, any one of the materials described above may be used in response to a target composition and the composition of the particles 14. Examples of a method for forming the matrix layer include, but are not particularly limited to, a spray application method, a spin coating method, a doctor blade method, a method including immersing the substrate 12 in a slurry in which the particles 14 are dispersed and allowing the substrate 12 to stand to sediment the particles 14, an LB method in which the particles 14 are aligned at a liquid-phase interface and then the immersed substrate 12 is pulled out, electrophoresis, and dipping. One or more of these methods may be employed.

In this matrix layer formation step, a shaped body including a matrix layer arranged on the template layer may be formed, the matrix layer being composed of a mixed material that contains a lead-containing material, an additional material containing lithium and boron, and an additional compound containing lithium. The additional compound may be added to enhance the sinterability of the matrix layer or the density of the matrix layer. The additional compound preferably has a lower melting point than the additional material containing lithium and boron. In this case, for example, it is possible to enhance the density of the matrix layer with the additional compound and then enhance the orientation with the additional material containing lithium and boron during the period for which the temperature is raised in the firing step, so that both the density and orientation can be enhanced. For example, the additional compound may be one or more of $Li_2CO_3$ and LiF. The amount of the additional compound added is preferably in the range of 0.2% by weight to 10% by weight, more preferably 1% by weight to 6% by weight, and still more preferably 1% by weight to 3% by weight with respect to the entire matrix layer. An amount of the additional compound added of 0.2% by weight or more results in the matrix layer having a higher density. At an amount added of 10% by weight or less, the additional compound is unlikely to remain after firing, which is preferred.

(3) Firing Step

In this step, the resulting shaped body is fired at a predetermined temperature to remove the resin 18, and the template layer 19 and a matrix layer 22 are formed into a piezoelectric/electrostrictive component 26. With respect to the firing temperature, firing is preferably performed at 900° C. to 1100° C., depending on the composition of the crystallographically oriented ceramic 40. The use of the additional material containing lithium and boron results in a reduction in the temperature at which the crystals are oriented. The firing atmosphere is not particularly limited but may be an air atmosphere. In the firing step, crystals of the matrix layer 22 are grown along the uniform crystal orientation of the template layer 19 in the predetermined direction owing to the effect of the additional material. In this way, the substrate 12 including the template layer 19 and the matrix layer 22 formed on the surface thereof is fired, affording the crystallographically oriented ceramic 40 provided with the piezoelectric/electrostrictive component 26 having uniform crystal orientation in a predetermined direction. It is speculated that the reason for this is that the additional material containing lithium and boron functions to promote the grain growth of the lead-containing material in such a manner that grains of the lead-containing material have a polyhedral shape.

(4) Post-Annealing Step

In this step, for example, in the case where the additional material 24 is left after the firing step, a treatment is performed in which the additional material 24 is removed by heating. Regarding post-annealing conditions, for example, the post-annealing may be performed under the same temperature, holding time, and atmospheric conditions as those in the firing step. The shaped body may be held at a temperature lower than the firing temperature, for example, at a temperature of 700° C. to 1000° C., for prolonged periods of time. Furthermore, the post-annealing may be performed in an atmosphere such that the additional material is easily evaporated by adjusting the oxygen partial pressure. Removal of the additional material 24 in this step permits the prevention of the presence of impurity-like substances in the piezoelectric/electrostrictive component 26, thus resulting in higher piezoelectric/electrostrictive properties. It is possible to produce the crystallographically oriented ceramic 40 having high crystal orientation and higher piezoelectric/electrostrictive properties through these steps.

In the method for producing the crystallographically oriented ceramic 40 according to this embodiment described above in detail, it is possible to easily produce a highly oriented ceramic by forming the matrix layer containing the additional material on the template layer having uniform crystal orientation and performing firing. Furthermore, the additional material containing lithium and boron evaporates easily during firing and is unlikely to remain in the crystallographically oriented ceramic 40, thus resulting in the production of the crystallographically oriented ceramic 40 with higher purity. Moreover, the particles 14 are mechanically fixed with the resin 18 formed by electrolytic polymerization, thus resulting in the template layer 19 with higher strength and resulting in extremely wider choices of the types of the substrate 12 and the particles 14. In addition, after the particle layer is formed on the substrate 12, the template layer 19 is formed by electrolytic polymerization, thus resulting in the template layer 19 with a higher density. Furthermore, the use of the additional compound for enhancing the sinterability results in the crystallographically oriented ceramic with a high density and a high degree of orientation.

It will be obvious that the present invention is not limited to the foregoing embodiment and that various modifications may be made without departing from the technical scope of the present invention.

For example, in the template layer preparation step according to the foregoing embodiment, the particles 14 are directly arranged on the substrate 12. Alternatively, the particles 14 may be arranged on a conductive electrode that is formed on the substrate 12 having insulating surfaces. In this case, the electrode used to fix the particles 14 can be used to drive the piezoelectric/electrostrictive component, which is preferred. For example, a material for the electrode is at least one selected from the group consisting of platinum, palladium, ruthenium, gold, silver, alloys thereof, and conductive polymers. A method for patterning the electrode is any of evaporation, sputtering, screen printing, electroless plating, interfacial polymerization of a monomer, and so forth. A region of the electrode where the particles 14 are not arranged may be subjected to masking or the like.

In the template layer preparation step according to the foregoing embodiment, when the template layer having uniform crystal orientation in a predetermined direction is prepared, the substrate 12 on which the particles 14 are arranged is used. Alternatively, the substrate 12 having uniform crystal orientation in a predetermined direction may be used. Examples of the substrate having uniform crystal orientation in a predetermined direction include single-crystal substrates each having uniform crystal orientation in a predetermined direction. Examples of a material for the single-crystal substrates include silicon, gallium arsenide, silicon carbide, alumina, strontium titanate, magnesium oxide, calcium fluoride, lithium niobate, lithium tantalate, potassium tantalate, and cerium oxide. Furthermore, films composed of platinum, titanium, strontium ruthenate, lanthanum nickelate, yttrium-stabilized zirconia, cerium oxide, and so forth may be formed as bottom electrodes and buffer layers, which are configured to relax the difference in lattice constant, on the single-crystal substrates. In this case, in the matrix layer formation step, the template layer 19 may be directly formed on a surface of the substrate having uniform crystal orientation in a predetermined direction.

In the foregoing embodiment, the substrate 12 on which the particles 14 are arranged is used as the template layer 19, and the matrix layer 22 is formed on the template layer. Alternatively, a method may be employed in which a sheet component in which the particles 14 having uniform crystal orientation in a predetermined direction are arranged so as to have a plate-like shape is used as a template layer, a sheet component in which the mixed material that contains the lead-containing material and the additional material containing lithium and boron are formed into a plate-like shape is used as a matrix layer, a laminate including these layers are alternately stacked is formed, and the laminate is fired.

As the particles 14 used in the particle layer formation treatment according to the embodiment, the polyhedral crystals of the lead-containing material are produced by hydrothermal synthesis or the like. Alternatively, for example, the particles 14 may be produced by a method described below. For example, the method may include preparing an aqueous solution used as a material for the template layer, adding gelatin to the prepared aqueous solution, performing a dispersion treatment with an emulsifier, and performing a hydrothermal synthesis treatment. That is, in the template layer preparation step, the template layer having uniform crystal orientation in a predetermined direction may be prepared with crystalline particles produced by adding gelatin to an aqueous solution containing lead and performing a dispersion treatment. Examples of the aqueous solution used as a material for the template layer include an aqueous lead solution in which lead acetate is dissolved, an aqueous zirconium solution in which zirconium oxychloride is dissolved, an aqueous titanium solution in which titanium chloride is dissolved, and an aqueous solution of potassium hydroxide in which potassium hydroxide is dissolved. In this case, it is possible to produce finer particles, resulting in a relatively thin crystallographically oriented ceramic. As gelatin used, bovine-derived gelatin and swine-derived gelatin may be used. Swine-derived gelatin is more preferred. In addition, acid-treated gelatin and alkali-treated gelatin may be used. Alkali-treated gelatin is more preferred. In this case, finer particles are easily produced. For example, the amount of gelatin added is preferably in the range of 0.2% by weight to 10% by weight and more preferably 1% by weight to 6% by weight with respect to the aqueous solution. For example, stirring is preferably performed with the emulsifier at 5000 rpm to 20,000 rpm and more preferably 8000 rpm to 15,000 rpm. The dispersion treatment with the emulsifier is preferably performed for 5 minutes to 30 minutes.

EXAMPLES

Specific examples of a method for producing a crystallographically oriented ceramic will be described below as Examples.

Example 1

Template Layer Preparation Step

A platinum substrate having a size of 10 mm×10 mm and a thickness of 0.5 mm was used as a substrate. Materials for a template layer were an aqueous lead solution containing lead acetate trihydrate (manufactured by Kanto Chemical Co., Inc.), ethylenediaminetetraacetic acid (manufactured by Kanto Chemical Co., Inc.), and potassium hydroxide (manufactured by Kanto Chemical Co., Inc.), an aqueous zirconium solution containing zirconium oxychloride octahydrate (manufactured by Kanto Chemical Co., Inc.), an aqueous solution of titanium chloride (manufactured by Wako Pure Chemical Industries, Ltd.), and an aqueous solution of potassium hydroxide (manufactured by Kanto Chemical Co., Inc). A raw material solution was prepared so as to have a molar ratio of Pb:Zr:Ti=1.1:0.7:0.3. Into a 100-mL stainless-steel pressure vessel having an inner wall lined with polytetrafluoroethylene, 30 mL of the raw material solution was charged. A hydrothermal synthesis treatment was performed at 165° C. for 4 hours, yielding lead zirconate titanate (hereinafter, referred to as "PZT") having a particle size of 2 μm and a cubic shape. Sodium dodecylbenzenesulfonate (manufactured by Kanto Chemical Co., Inc.) and pyrrole (manufactured by Kanto Chemical Co., Inc.) were added to 30 mL of water to prepare an aqueous pyrrole solution so as to have a concentration of 0.01 mol/L. The resulting aqueous solution was charged into a beaker. To the aqueous solution, 1% by weight of the cube-shaped PZT particles produced by hydrothermal synthesis were added. The mixture was subjected to a dispersion treatment with a homogenizer, preparing a suspension (slurry monomer solution). Next, the foregoing substrate was placed on the bottom of the beaker containing the solution and allowed to stand for 10 minutes until the PZT particles were sedimented. Then, a stainless-steel opposite electrode was arranged so as to be in parallel with the substrate and in such a manner that the electrodes were separated by 1 mm. The platinum substrate was connected to a power supply so as to serve as a negative electrode. The opposite electrode was connected to the power supply so as to serve as a positive electrode. A triangular wave having with a peak voltage of 5 V and a frequency of 2 Hz was applied 30 times to synthesize polypyrrole on the substrate. The substrate provided with polypyrrole was shaken in the aqueous solution to roughly remove an excess amount of the PZT particles. The substrate was then subjected to ultrasonic cleaning in deionized water to remove the PZT particles attached to portions other than the substrate, thereby producing the platinum substrate on which the PZT particles were fixed in such a manner that the crystal orientation was parallel to the [100] direction. The particle size of the PZT particles is used to indicate a median size (D50) determined with a dynamic scattering particle size distribution analyzer Zetasizer Nano-ZS, manufactured by Spectris Co., Ltd., using water as a dispersion medium. The ultrasonic cleaning for removing the PZT particles was performed with an ultrasonic cleaner (UT-106, manufactured by Sharp Corporation) at 40 kHz for 1 minute.

(Matrix Layer Formation Step and Firing Step)

With respect to a material for a matrix layer (hereinafter, referred to as a "piezoelectric material"), the piezoelectric material (hereinafter, also referred to as "20PMN-80PZT") containing lead magnesium niobate ($Pb(Mg,Nb)O_3$), in which 13 mol % of magnesium was substituted by nickel, and lead zirconate titanate ($Pb(Zr,Ti)O_3$) in a composition ratio of 2:8 was produced by a conventional solid-phase reaction technique with lead oxide (manufactured by Mitsui Mining & Smelting Co., Ltd.), titanium oxide (manufactured by Ishihara Sangyo Kaisha, Ltd.), zirconium oxide (manufactured by Nippon Denko Co., Ltd), magnesium carbonate (manufactured by Konoshima Chemical Co., Ltd.), niobium oxide (manufactured by Mitsui Mining & Smelting Co., Ltd.), and nickel oxide (manufactured by Seido Chemical Industry Co., Ltd). $LiBO_2$ (manufactured by Kojundo Chemical Lab. Co., Ltd.) was prepared as an orientation-promoting additive. Then 6% by weight of $LiBO_2$ was added to the piezoelectric material (20PMN-80PZT). The mixture was mixed for 24 hours in a polyethylene vessel using acetone as a solvent. The mixture was then dried to form a powder. A butyral-based binder (BL-S, manufactured by Sekisui Chemical Co., Ltd.), a dispersant (SPO-30, manufactured by Kao Corporation), a plasticizer (DOP, manufactured by Kurogane Kasei Co., Ltd.), and a solvent (terpineol, manufactured by Katayama Chemical Industries Co., Ltd.) were added to the resulting powder. The resulting mixture was kneaded with a three-roll mill to form a paste. The resulting $LiBO_2$-containing 20PMN-80PZT paste was uniformly applied by spin coating onto the substrate, on which the PZT particles had been arranged, at 1000 rpm for 30 seconds. The applied paste was dried on a hot plate at 90° C. for 5 minutes, thereby affording a shaped body. The shaped body was degreased at 500° C. for 2 hours. The degreased shaped body was fired under conditions in which the shaped body was heated at 200° C./h and then held at 1000° C. for 3 hours. An atmosphere during the firing was air. After the completion of the firing, the temperature was reduced at 200° C./h. The resulting crystallographically oriented ceramic was defined as a ceramic obtained in Example 1.

Example 2

A $LiBO_2$-containing 20PMN-80PZT paste was prepared in the same procedure as in Example 1. A (100)-oriented single-crystal strontium titanate ($SrTiO_3$) substrate provided with (100) strontium ruthenate ($SrRuO_3$) formed as a bottom electrode was used. The resulting paste was applied by spin coating onto the SRO/STO substrate to form a film. The film was degreased and fired. The conditions of the film formation, calcination, and firing were the same as in Example 1. The resulting crystallographically oriented ceramic was defined as a ceramic obtained in Example 2.

Example 3

Cube-shaped PZT particles the same as in Example 1 were mixed with a butyral-based binder (BM-2, manufactured by Sekisui Chemical Co., Ltd.), a solvent (an equal volume mixture of toluene and isopropyl alcohol), and a plasticizer (DOP) to form a slurry. The slurry was formed into a tape having a thickness of about 2 μm in the dry state by a doctor blade method. A $LiBO_2$-containing 20PMN-80PZT powder was formed into a tape having a thickness of about 2 μm in the dry state by the same process. These tapes were cut into tape pieces. The tape pieces including only the PZT particles were used as template layers. The tape pieces including the $LiBO_2$-containing 20PMN-80PZT were used as matrix layers. The tape pieces were alternately stacked to form a laminate. The laminate was press-bonded under heat and pressure in order to promote the adhesion of the stacked tape pieces. The resulting laminate was degreased in air at 600° C. and then fired at 1000° C. for 3 hours. The resulting crystallographically oriented ceramic was defined as a ceramic obtained in Example 3.

Comparative Example 1

A ceramic was produced in the same procedure as in Example 1, except that $LiBO_2$ was not added to the matrix layer. The resulting ceramic was defined as a ceramic obtained in Comparative Example 1. Note that the platinum substrate on which the cube-shaped PZT particles had been fixed (i.e., the template layer had been formed) was used.

Comparative Example 2

A ceramic was produced in the same procedure as in Example 1, except that the template layer in which the cube-shaped PZT particles were not fixed was used. The resulting ceramic was defined as a ceramic obtained in Comparative Example 2. Note that $LiBO_2$ was added to the matrix layer.

[Photography with Electron Microscope]

Figure 4:
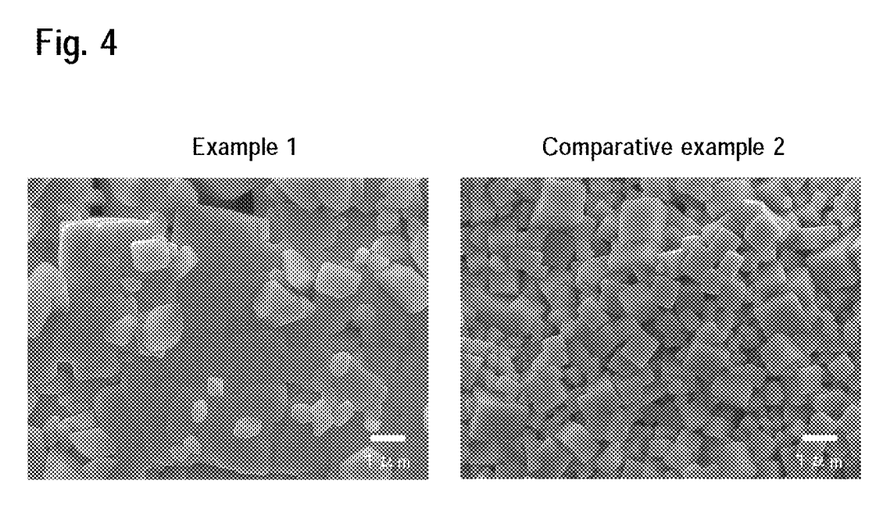
FIG. 4 shows SEM photographs in Example 1 and Comparative Example 2

Microstructures of the ceramics produced in Examples 1 to 3 and Comparative Examples 1 and 2 were observed with a scanning electron microscope (JSM-7000F, manufactured by JEOL Ltd). FIG. 4 shows SEM micrographs of the ceramics produced in Example 1 and Comparative Example 2. As illustrated in FIG. 4, many crystalline particles grown so as to have a plate-like shape were observed in the ceramic produced in Example 1. Many cube-shaped particles were observed in the ceramic produced in Comparative Example 2.

[X-Ray Diffraction Measurement and Calculation of Degree of Orientation]

Figure 5:
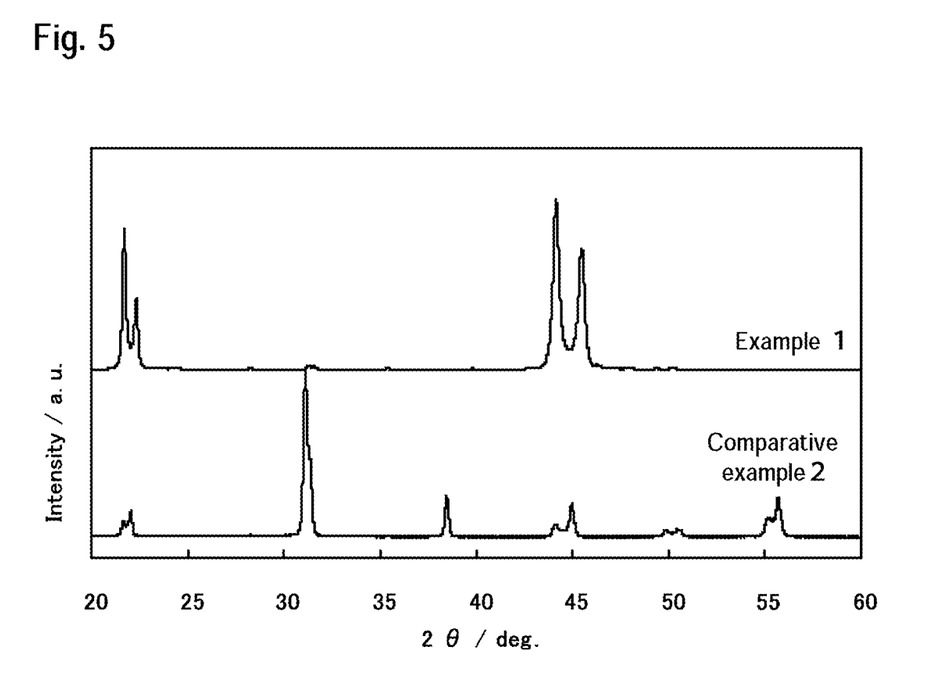
FIG. 5 shows X-ray diffraction results in Example 1 and Comparative Example 2.

XRD patterns were measured by irradiating the crystal planes of the crystallographically oriented ceramics produced in Examples 1 to 3 and Comparative Examples 1 and 2 with X-rays using an X-ray diffractometer (X'Pert PRO MPD, manufactured by Spectris Co., Ltd.). FIG. 5 shows X-ray diffraction results of ceramics produced in Example 1 and Comparative Example 2. The degrees of orientation of the pseudocubic (100) plane were determined by the Lotgering method using the measurement results. That is, the degrees of orientation of the pseudocubic (100) plane were calculated from Equation (1) using peaks corresponding to the pseudocubic (100), (110), and (111) planes. According to the Lotgering method, the degree of orientation was determined by measuring an XRD pattern from the oriented plane of each of the crystallographically oriented ceramics and performing calculation using Equation (1). In Equation (1), $\Sigma I(hkl)$ represents the sum of X-ray diffraction intensities from all crystal planes (hkl) measured in the crystallographically oriented ceramic. $\Sigma I_0(hkl)$ represents the sum of X-ray diffraction intensities from all crystal planes (hkl) measured in a nonoriented ceramic having the same composition as the crystallographically oriented ceramic. $\Sigma' I(HKL)$ represents the sum of X-ray diffraction intensities from crystallographically equivalent specific crystal planes (e.g., a set of planes (100)) measured in the crystallographically oriented ceramic. $\Sigma' I_0$ (HKL) represents the sum of X-ray diffraction intensities from specific crystal planes measured in the nonoriented ceramic having the same composition as the crystallographically oriented ceramic. Table 1 shows the degree of orientation determined by calculation.

[Equation 1]

Degree of orientation =

$$\frac{\dfrac{\sum' I(HKL)}{\sum I(hk)l} - \dfrac{\sum' I_0(HKL)}{\sum I_0(hk)l}}{1 - \dfrac{\sum' I_0(HKL)}{\sum I_0(hk)l}} \times 100\% \qquad \text{Equation (1)}$$

TABLE 1

|  | Template layer | Degree of orientation (%) |
|---|---|---|
| Example 1 | Crystalline particles arranged on substrate | 96 |
| Example 2 | Oriented substrate used | 99 |
| Example 3 | Sheet article | 70 |
| Comparative Example 1 | Crystalline particles arranged on substrate | 0 |
| Comparative Example 2 | PZT particles were not used | 0 |

(Experimental Result)

In Comparative Example 1, in which although the template layer had uniform crystal orientation, $LiBO_2$ was not added to the matrix layer, and Comparative Example 2, in which although $LiBO_2$ was added to the matrix layer, the template layer did not have uniform crystal orientation, the results demonstrated that the degrees of orientation estimated by the Lotgering method were low and that the ceramics were negligibly oriented. In contrast, in Examples 1 to 3, in which the template layers had uniform crystal orientation and $LiBO_2$ was added to the matrix layers, the results demonstrated that the degrees of orientation estimated by the Lotgering method were as high as 70% or more and that the ceramics were oriented. Furthermore, the results demonstrated that according to the present invention, it is possible to produce various crystallographically oriented ceramics, such as the crystallographically oriented ceramic produced by coating the template particles with the matrix layer and performing firing (Example 1), the oriented film including the single-crystal substrate composed of, for example, $SrTiO_3$ serving as the template layer (Example 2), and the oriented sheet including the template layers and the matrix layers alternately stacked (Example 3).

Examples 4 to 6

A ceramic according to each of Examples 4 to 6 was produced in the same procedure as in Example 1, except that the orientation-promoting additive, the piezoelectric material (20PMN-80PZT), and an additional compound to enhance the density were mixed to form a corresponding one of the matrix layers. Specifically, 1.0% by weight of $LiBO_2$ (manufactured by Kojundo Chemical Lab. Co., Ltd., melting point: 799° C.) serving as the orientation-promoting additive and 3.0% by weight of $Li_2CO_3$ (manufactured by Kanto Chemical Co., Inc., melting point: 730° C.) serving as the additional compound to enhance the density were added to the piezoelectric material (20PMN-80PZT). The resulting crystallographically oriented ceramic was defined as a ceramic obtained in Example 4. Furthermore, 0.2% by weight of $Li_2B_4O_7$ (manufactured by Kojundo Chemical Lab. Co., Ltd., melting point: 886° C.) serving as the orientation-promoting additive and 3.0% by weight of LiF (manufactured by Kojundo Chemical Lab. Co., Ltd., melting point: 851° C.) serving as the additional compound to enhance the density were added to the piezoelectric material (20PMN-80PZT). The resulting crystallographically oriented ceramic was defined as a ceramic obtained in Example 5. Moreover, 1.0% by weight of $LiBO_2$ (manufactured by Kojundo Chemical Lab. Co., Ltd., melting point: 799° C.) serving as the orientation-promoting additive and 3.0% by weight of LiF (manufactured by Kojundo Chemical Lab. Co., Ltd., melting point: 851° C.) serving as the additional compound to enhance the density were added to the piezoelectric material (20PMN-80PZT). The resulting crystallographically oriented ceramic was defined as a ceramic obtained in Example 6. The degrees (%) of orientation of the ceramics produced in Examples 4 to 6 were also measured.

[Calculation of In-Plane Coverage]

The microstructures of the ceramics produced in Examples 1 and 4 to 6 were observed with a scanning electron microscope (JSM-7000F, manufactured by JEOL Ltd). In-plane coverage (%) serving as an indicator of the density was determined from the observation results. First, any area having a size of 100 μm×100 μm observed with the SEM was chosen. Void regions were determined by image analysis based on a difference in contrast. Next, a void area A was subtracted from the total area S to determine the area C of a region (region of the crystallographically oriented ceramic) other than the voids. The resulting area C was divided by the total area S and multiplied by 100. The resulting value was defined as the in-plane coverage. That is, in-plane coverage (%)=(S−A)/S×100. Table 2 shows the degrees of orientation and the in-plane coverage of the ceramics produced in Examples 1 and 4 to 6.

TABLE 2

|  | Template layer | Degree of orientation (%) | In-plane coverage (%) |
|---|---|---|---|
| Example 1 | Crystalline particles arranged on substrate | 96 | 96 |
| Example 4 | Crystalline particles arranged on substrate | 97 | 100 |
| Example 5 | Crystalline particles arranged on substrate | 94 | 100 |
| Example 6 | Crystalline particles arranged on substrate | 73 | 100 |

(Experimental Result)

As shown in Table 2, the results demonstrated that the addition of the orientation-promoting additive and the lithium-containing additional compound (e.g., $Li_2CO_3$ or LiF) to enhance the sinterability when the crystallographically oriented ceramic was produced resulted in a higher degree of orientation and a higher density. In particular, the results demonstrated that in the case where the melting point of the sinterability-enhancing additional compound was lower than that of the orientation-promoting additive, the degree of orientation and the density were increased. It was speculated that the reason for this was that during the period for which the temperature was raised in the firing step, the sinterability-enhancing additional compound resulted in an increase in density, and then the orientation-promoting additive functioned to allow the ceramic to be oriented in a specific plane. It was speculated that in the case where the melting point of the sinterability-enhancing additional compound was higher than that of the orientation-promoting additive, oriented crystals were partially sacrificed for sintering, thereby leading to a slightly low degree of orientation. Note that the results demonstrated that in Examples 4 to 6, the additive containing lithium and boron resulted in a higher degree of orientation, regardless of the melting points of the orientation-promoting additive and the sinterability-enhancing additional compound.

Example 7

A thinner crystallographically oriented ceramic according to Example 7 was produced, the ceramic including the template layer having a smaller particle size. A platinum substrate having a size of 10 mm×10 mm and a thickness of 0.5 mm was used as a substrate. Materials for a template layer were an aqueous lead solution containing lead acetate trihydrate (manufactured by Kanto Chemical Co., Inc.), ethylenediaminetetraacetic acid (manufactured by Kanto Chemical Co., Inc.), and potassium hydroxide (manufactured by Kanto Chemical Co., Inc.), an aqueous zirconium solution containing zirconium oxychloride octahydrate (manufactured by Kanto Chemical Co., Inc.), an aqueous solution of titanium chloride (manufactured by Wako Pure Chemical Industries, Ltd.), and an aqueous solution of potassium hydroxide (manufactured by Kanto Chemical Co., Inc). A mixed solution was prepared so as to have a molar ratio of Pb:Zr:Ti=1.1:0.7:0.3. To the mixed solution, 2.5% by weight of gelatin (alkali-treated swine-derived gelatin, manufactured by Jellice Co., Ltd.) was added. The resulting mixture was subjected to dispersion treatment with an emulsifier (Clearmix CLM-0.8S, manufactured by M Technique Co., Ltd.) at 10,000 rpm for 10 minutes. Into a 100-mL stainless-steel pressure vessel having an inner wall lined with polytetrafluoroethylene, 30 mL of the resulting raw material solution was charged. A hydrothermal synthesis treatment was performed at 165° C. for 4 hours, yielding cube-shaped PZT particles having a particle size of 0.5 µm. The template layer preparation step the same as in Example 1 was performed with the PZT particles. Next, the matrix layer formation step was performed as in Example 1, except that 1% by weight of $LiBO_2$ and 3% by weight of lithium fluoride (LiF) serving as a sinterability-enhancing additive compound were added to the piezoelectric material (20PMN-80PZT). The resulting crystallographically oriented ceramic was defined as a ceramic obtained in Example 7. The crystallographically oriented ceramic produced in Example 7 had a film thickness of 2 µm.

(Reference Experiment)

Figure 6:
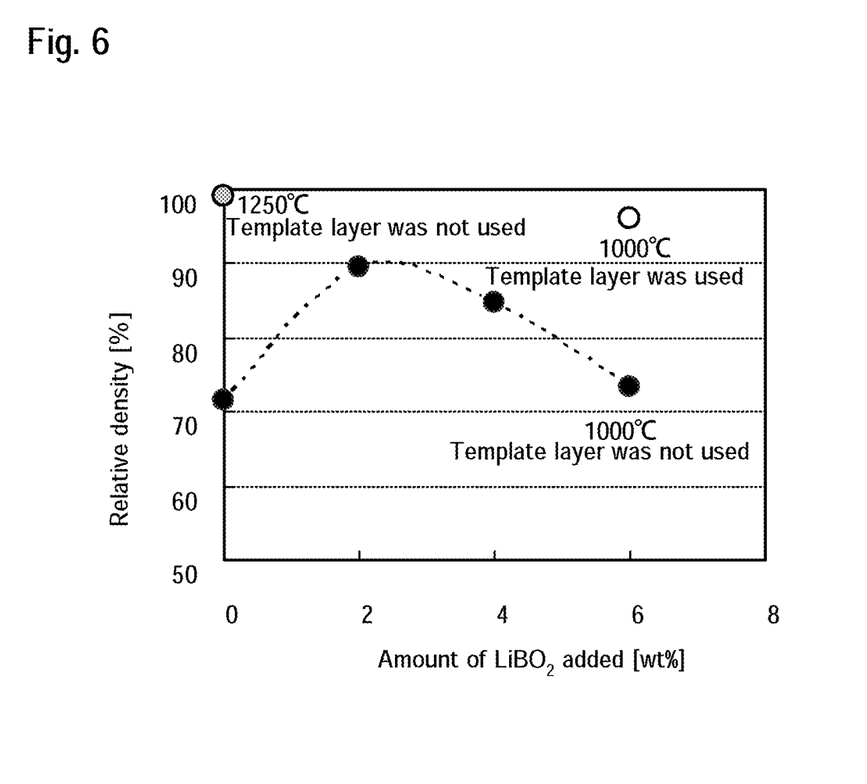
FIG. 6 is a graph illustrating the relationship among the amount of $LiBO_2$ added, the firing temperature, and the relative density of a piezoelectric component.

Whether $LiBO_2$ can be used as a sintering aid was studied. $LiBO_2$ was added to the powder having a composition of 20PMN-80PZT produced in Example 1 in an amount of 0% by weight, 2% by weight, 4% by weight, or 6% by weight. The mixture was formed into pellets without using the template layer. The pellets were fired at 1000° C. Separately, the powder having a composition of 20PMN-80PZT produced in Example 1, the powder being free from $LiBO_2$, was formed into pellets without using the template layer. The pellets were fired at 1250° C. In addition, 6% by weight of $LiBO_2$ was added to the powder having a composition of 20PMN-80PZT produced in Example 1. The mixture was fired at 1000° C. using the template layer according to Example 1. The relative densities with respect to the true density of the resulting samples were determined. Table 3 shows the results as reference data. FIG. 6 is a graph illustrating the relationship among the amount of $LiBO_2$ added, the relative density, and the firing temperature. The results demonstrated that in the case where the template layer was absent, each of the $LiBO_2$-containing samples had a relative density of 90% or less; hence, $LiBO_2$ did not function as a sintering aid to increase the sintered density. Furthermore, it was speculated that the presence of the template layer resulted in an increase in relative density; hence, $LiBO_2$ functioned as a sintering aid.

TABLE 3

| $LBO_2$ (% by weight) | Relative density (%) (Template layer was used) | | Relative density (%) (Template layer was not used) |
|---|---|---|---|
| | Fired at 1000° C. | Fired at 1250° C. | Fired at 1000° C. |
| 0 | 71 | 99 | |
| 2 | 90 | | |
| 4 | 85 | | |
| 6 | 73 | | 96 |

The present application claims the benefit of the priority from Japanese Patent Application No. 2009-167722 filed on Jul. 16, 2009 and Japanese Patent Application No. 2010-113575 filed on May 17, 2010, which are hereby incorporated by reference herein in their entirety.

What is claimed is:

1. A method for producing a crystallographically oriented ceramic, comprising:
   a preparation step of preparing a template layer having uniform crystal orientation in a predetermined direction;
   a formation step of forming a shaped body including a matrix layer arranged on the template layer, the matrix layer being composed of a mixed material that contains a lead-containing material and an additional material containing lithium and boron; and
   a firing step of firing the shaped body formed in the formation step at a predetermined firing temperature.

2. The method for producing a crystallographically oriented ceramic according to claim 1, wherein in the preparation step, the template layer is prepared by fixing crystalline particles composed of a lead-containing material on a substrate with a fixing compound by heat or a potential difference.

3. The method for producing a crystallographically oriented ceramic according to claim 2, wherein in the preparation step, the crystalline particles have a cubic shape and are fixed on the substrate.

4. The method for producing a crystallographically oriented ceramic according to claim 1, wherein in the formation step, one or more of $LiBO_2$, $Li_2B_4O_7$, $LiB(OH)_4$, $Li_3BO_3$, $Li_6B_4O_9$, $LiB_3O_5$, and $Li_2B_8O_{13}$ are mixed as the additional material.

5. The method for producing a crystallographically oriented ceramic according to claim 1, wherein in the formation step, the shaped body including the matrix layer arranged on the template layer is formed, the matrix layer being composed of a mixed material that contains the lead-containing material, the additional material containing lithium and boron, and an additional compound containing lithium and having a lower melting point than the additional material.

6. The method for producing a crystallographically oriented ceramic according to claim 5, wherein in the formation step, one or more of $Li_2CO_3$ and LiF is mixed as the additional compound.

7. The method for producing a crystallographically oriented ceramic according to claim 1, wherein in the firing step, firing is performed at 900° C. to 1100° C.

8. The method for producing a crystallographically oriented ceramic according to claim 1,
further comprising, after the firing step, a post-annealing step of heating the shaped body to remove lithium and boron.

9. The method for producing a crystallographically oriented ceramic according to claim 1, wherein in the preparation step, the template layer having uniform crystal orientation in a predetermined direction is prepared with the crystalline particles that are produced by adding gelatin to an aqueous solution containing lead and subjecting the resulting mixture to a dispersion treatment.

10. The method for producing a crystallographically oriented ceramic according to claim 1, wherein the additional material containing lithium and boron is present in an amount of 0.05 to 10% by weight.

11. The method for producing a crystallographically oriented ceramic according to claim 1, wherein the template layer comprises a plurality of crystalline particles.

* * * * *